United States Patent
Kim et al.

(10) Patent No.: US 9,986,603 B2
(45) Date of Patent: May 29, 2018

(54) MULTILAYERED OPTICAL FILM AND DISPLAY DEVICE INCLUDING OPTICAL FILM

(71) Applicants: SAMSUNG ELECTRONICS CO., LTD., Suwon-si (KR); CHEIL INDUSTRIES INC., Gumi-si (KR)

(72) Inventors: Hee-Kyung Kim, Seongnam-si (KR); Moon Yeon Lee, Osan-si (KR); Kyoung Ah Oh, Seoul (KR); Kyu Yeol In, Seoul (KR); Ji-Hoon Lee, Suwon-si (KR); Myung Sup Jung, Seongnam-si (KR); Sang ah Gam, Seoul (KR)

(73) Assignees: SAMSUNG ELECTRONICS CO., LTD., Gyeonggi-Do (KR); CHEIL INDUSTRIES INC., Gyeongsangbuk-Do (KR)

( * ) Notice: Subject to any disclaimer, the term of this patent is extended or adjusted under 35 U.S.C. 154(b) by 0 days. days.

(21) Appl. No.: 15/584,894

(22) Filed: May 2, 2017

(65) Prior Publication Data
US 2017/0303349 A1    Oct. 19, 2017

Related U.S. Application Data

(63) Continuation of application No. 14/141,192, filed on Dec. 26, 2013, now Pat. No. 9,661,692.

(30) Foreign Application Priority Data

Dec. 27, 2012  (KR) .......... 10-2012-0155343
Dec. 17, 2013  (KR) .......... 10-2013-0157414

(51) Int. Cl.
  *H01L 51/52*     (2006.01)
  *H05B 33/02*     (2006.01)
  *G02B 5/30*      (2006.01)

(52) U.S. Cl.
  CPC .......... *H05B 33/02* (2013.01); *G02B 5/3016* (2013.01); *H01L 51/5281* (2013.01)

(58) Field of Classification Search
  CPC .... H05B 33/02; H01L 51/5281; G02B 5/3016
  See application file for complete search history.

(56) References Cited

U.S. PATENT DOCUMENTS 7,274,511 B2   9/2007   Noguchi
7,446,462 B2   11/2008  Lim et al.
(Continued)

FOREIGN PATENT DOCUMENTS

JP   2002156527   5/2002
JP   2003332068   11/2003
(Continued)

OTHER PUBLICATIONS

Korean Office Action—Korean Patent Application No. 10-2013-0157414 dated Feb. 3, 2017, citing references listed within.
(Continued)

*Primary Examiner* — Donald Raleigh
(74) *Attorney, Agent, or Firm* — Cantor Colburn LLP

(57) ABSTRACT

An optical film includes: a liquid crystal coating; and a base layer on the liquid crystal coating, wherein the liquid crystal coating has reversed wavelength dispersion and in-plane retardation for a reference wavelength ranging from 126 nm to 153 nm, and the base layer has in-plane retardation ranging from about 0 to about 50 nm and out-of-plane retardation ranging from about 0 nm to about 100 nm.

12 Claims, 14 Drawing Sheets

(56) References Cited

U.S. PATENT DOCUMENTS

| | | | |
|---|---|---|---|
| 7,508,474 B2 | 3/2009 | Kashima | |
| 7,557,883 B2 | 7/2009 | Kawamoto et al. | |
| 7,738,065 B2 | 6/2010 | Shutou et al. | |
| 7,811,467 B2 | 10/2010 | Yamahara et al. | |
| 7,875,341 B2 | 1/2011 | Toyoshima et al. | |
| 8,064,136 B2 | 11/2011 | Kashima et al. | |
| 8,119,026 B2 | 2/2012 | Parri et al. | |
| 8,149,354 B2 | 4/2012 | Ojima et al. | |
| 8,355,203 B2 | 1/2013 | Kashima et al. | |
| 8,493,659 B2 | 7/2013 | Suzuki et al. | |
| 8,610,852 B2 | 12/2013 | Lee et al. | |
| 8,821,994 B2* | 9/2014 | Harris | C09K 19/3842 349/117 |
| 9,086,542 B2 | 7/2015 | Miyatake et al. | |
| 9,217,887 B2 | 12/2015 | Yanai | |
| 9,383,493 B2 | 7/2016 | Miyatake et al. | |
| 2004/0051950 A1 | 3/2004 | Noguchi | |
| 2006/0132686 A1* | 6/2006 | Jeon | G02F 1/133634 349/117 |
| 2007/0035839 A1 | 2/2007 | Ibuki et al. | |
| 2007/0298191 A1 | 12/2007 | Yamahara et al. | |
| 2009/0103016 A1* | 4/2009 | Shutou | G02B 5/3033 349/96 |
| 2009/0296213 A1 | 12/2009 | Ito | |
| 2010/0020273 A1 | 1/2010 | Toyama et al. | |
| 2010/0072422 A1 | 3/2010 | Parri et al. | |
| 2010/0157195 A1 | 6/2010 | Miyatake et al. | |
| 2010/0157204 A1 | 6/2010 | Ichihashi et al. | |
| 2010/0171894 A1 | 7/2010 | Lee et al. | |
| 2010/0176382 A1 | 7/2010 | Park et al. | |
| 2011/0058131 A1 | 3/2011 | Ishiguro | |
| 2012/0212692 A1 | 8/2012 | Ryu et al. | |
| 2012/0249900 A1 | 10/2012 | Koike et al. | |
| 2012/0293734 A1 | 11/2012 | Saneto et al. | |
| 2013/0044267 A1* | 2/2013 | Ishiguro | G02B 27/26 349/15 |
| 2013/0093992 A1 | 4/2013 | Takahashi et al. | |
| 2013/0155359 A1* | 6/2013 | Wu | G02B 5/3016 349/117 |
| 2015/0205142 A1* | 7/2015 | Kim | G02B 27/26 349/15 |

FOREIGN PATENT DOCUMENTS

| | | |
|---|---|---|
| JP | 2004233872 | 8/2004 |
| JP | 2004326089 | 11/2004 |
| JP | 2007002209 | 1/2007 |
| JP | 2008040487 | 2/2008 |
| JP | 2009009062 | 1/2009 |
| JP | 4316131 | 8/2009 |
| JP | 2010015157 | 1/2010 |
| JP | 2010177133 | 8/2010 |
| JP | 2010256831 | 11/2010 |
| JP | 2010276713 | 12/2010 |
| JP | 2010282153 | 12/2010 |
| JP | 2011095390 | 5/2011 |
| JP | 2012018396 | 1/2012 |
| JP | 2012198491 | 10/2012 |
| JP | 2012212034 | 11/2012 |
| KR | 100624307 B1 | 9/2006 |
| KR | 1020070067245 A | 6/2007 |
| KR | 1020080068034 | 7/2008 |
| KR | 1020100123624 | 11/2010 |
| KR | 1020110037211 | 4/2011 |
| KR | 101132995 | 3/2012 |
| KR | 101139267 B1 | 5/2012 |
| KR | 1020120073193 | 7/2012 |

OTHER PUBLICATIONS

Korean Office Action—Korean Application No. 10-2013-0157414 dated May 20, 2016, citing JP2011-095390. JP2009-009062 and US2012-0293734.

Japan Office Action—Japanese Patent Application No. 2013-264997 dated Sep. 11, 2017, references cited within.

Japanese Office Action—Japan Application No. 2013-264997 dated Mar. 5, 2018, citing references listed within.

* cited by examiner

MULTILAYERED OPTICAL FILM AND DISPLAY DEVICE INCLUDING OPTICAL FILM

CROSS REFERENCE TO RELATED APPLICATIONS

This application is a continuation of U.S. patent application Ser. No. 14/141,192, filed on Dec. 26, 2013, which claims priority to Korean Patent Application No. 10-2012-0155343 filed on Dec. 27, 2012 and Korean Patent Application No. 10-2013-0157414 filed on Dec. 17, 2013, and all the benefits accruing therefrom under 35 U.S.C. § 119, the entire contents of which are incorporated herein by reference.

BACKGROUND

(a) Field

Embodiments relate to an optical film and a display device including the same.

(b) Description of the Related Art

Flat panel displays may be classified into emitting display devices that emit light by themselves and non-emitting display devices that require separate light sources. Optical compensation films such as phase difference films may often be used for improving image quality of the flat panel displays.

In an emitting display device, for example, an organic light emitting display, visibility and contrast ratio may be decreased due to reflection of external light by metal such as an electrode in the display device. In order to reduce such deterioration, a polarizing plate and a phase difference film are used to prevent the external light reflected in the display device from leaking out of the display device.

In a liquid crystal display ("LCD"), which is a non-emitting display device, reflection of external light and sunglass effect may be reduced by converting linear polarization into circular polarization according to the types of the LCD including a transmissive type, a transflective type, and a reflective type, thereby improving the image quality of the LCD.

However, developed optical compensation films may have insufficient compensation characteristics.

SUMMARY

An optical film includes: a liquid crystal coating; and a base layer on the liquid crystal coating, wherein the liquid crystal coating has reversed wavelength dispersion and in-plane retardation for a reference wavelength ranging from 126 nm to 153 nm, and the base layer has in-plane retardation ranging from about 0 to about 50 nm and out-of-plane retardation ranging from about 0 nm to about 100 nm.

The in-plane retardation of the liquid crystal coating may range from about 130 nm to about 142 nm.

Short-wavelength dispersion (=retardation for incident light with a wavelength of about 450 nm/retardation for incident light with a wavelength of about 550 nm) of the liquid crystal coating may be smaller than about one, and long-wavelength dispersion (=retardation for incident light with a wavelength of about 650 nm/retardation for incident light with a wavelength of about 550 nm) of the liquid crystal coating may be greater than about one.

The in-plane retardation of the base layer may range from about 0 to about 10 nm, and the out-of-plane retardation of the base layer may range from about 0 nm to about 70 nm.

The in-plane retardation of the base layer may be substantially equal to about 0 nm, and the out-of-plane retardation of the base layer may range from about 0 nm to about 60 nm.

The optical film may further include: a substrate layer under the liquid crystal coating; and an alignment layer disposed between the substrate layer and the liquid crystal coating.

The alignment layer has unevenness aligned in a direction.

The unevenness of the alignment layer may be formed by nano imprint.

The alignment layer may include a photosensitive resin.

The liquid crystal coating may include a quarter-wave plate.

The optical film may further include a polarization layer on the liquid crystal coating.

An organic light emitting display includes: an organic light emitting panel; and an optical film on the organic light emitting panel, wherein the optical film includes a liquid crystal coating and a base layer on the liquid crystal coating, the liquid crystal coating has reversed wavelength dispersion and in-plane retardation for a reference wavelength ranging from 126 nm to 153 nm, and the base layer has in-plane retardation ranging from about 0 to about 50 nm and out-of-plane retardation ranging from about 0 nm to about 100 nm.

The in-plane retardation of the liquid crystal coating may range from about 130 nm to about 142 nm.

Short-wavelength dispersion (=retardation for incident light with a wavelength of about 450 nm/retardation for incident light with a wavelength of about 550 nm) of the liquid crystal coating may be smaller than about one, and long-wavelength dispersion (=retardation for incident light with a wavelength of about 650 nm/retardation for incident light with a wavelength of about 550 nm) of the liquid crystal coating may be greater than about one.

The in-plane retardation of the base layer may range from about 0 to about 10 nm, and the out-of-plane retardation of the base layer may range from about 0 nm to about 70 nm.

The in-plane retardation of the base layer may be substantially equal to about 0 nm, and the out-of-plane retardation of the base layer may range from about 0 nm to about 60 nm.

The optical film may further include: a substrate layer under the liquid crystal coating; and an alignment layer disposed between the substrate layer and the liquid crystal coating.

The alignment layer has unevenness aligned in a direction.

DETAILED DESCRIPTION

Figure 1:
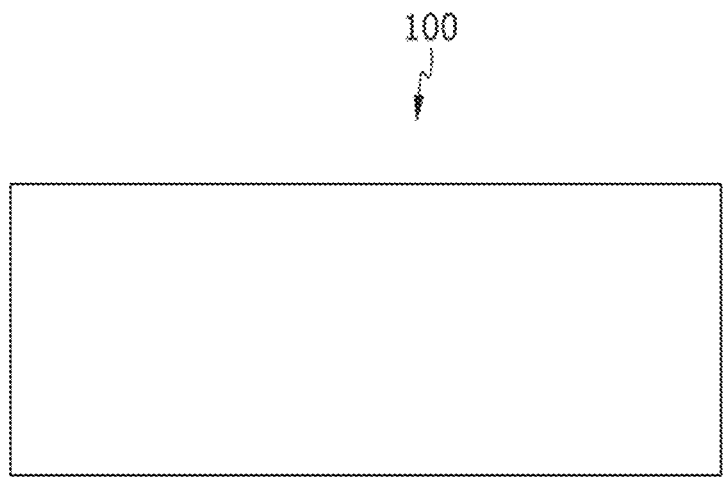
FIG. 1 and FIG. 2 are schematic sectional views of an optical film for a display device according to exemplary embodiments.

Aspects of one or more of the embodiments will be described more fully hereinafter with reference to the accompanying drawings. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

An optical film for a display device according to an exemplary embodiment is described in detail with reference to FIG. 1 and FIG. 2.

Figure 2:
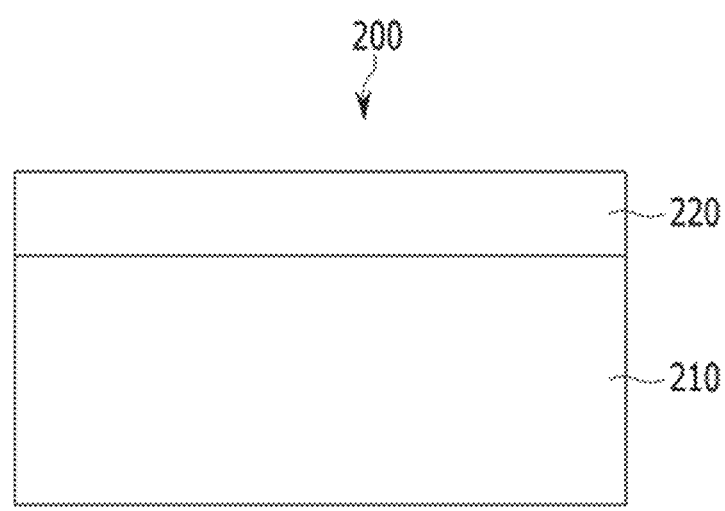

FIG. 1 and FIG. 2 are schematic sectional views of an optical film for a display device according to exemplary embodiments.

Referring to FIG. 1, an optical film 100 for a display device according to an exemplary embodiment may include a liquid crystal material or a liquid crystal composition having reversed wavelength dispersion, which has a retardation value increasing as the wavelength of incident light increases. For example, short-wavelength dispersion (=retardation for incident light with a wavelength of about 450 nm/retardation for incident light with a wavelength of about 550 nm) of the optical film 100 is smaller than about one, and long-wavelength dispersion (=retardation for incident light with a wavelength of about 650 nm/retardation for incident light with a wavelength of about 550 nm) of the optical film 100 is greater than about one. Examples of liquid crystal materials having reversed wavelength dispersion are disclosed in US Patent Application Publication No. 2010/0072422 A1, which is hereby incorporated by reference.

According to an exemplary embodiment, an in-plane retardation Ro of the optical film 100 for incident light having a wavelength of about 550 nm (referred to as a "reference wavelength" hereinafter) may range from about 126 nm to about 153 nm, for example, about 130 nm to about 142 nm. The in-plane retardation Ro is given by Ro=$(n_x-n_y) \times d$, where d denotes a thickness of the optical film 100, $n_x$ and $n_y$ denote refractive coefficients in two orthogonal directions in a plane substantially perpendicular to a thickness direction, and $n_x \, n_y$. Therefore, the optical film 100 may serve as a quarter-wave plate.

According to an exemplary embodiment, the optical film 100 may have a thickness from about 2.8 μm to about 3.4 μm.

Referring to FIG. 2, an optical film 200 for a display device according to an exemplary embodiment may include a substrate layer 210 and a liquid crystal coating 220 on the substrate layer 210.

The liquid crystal coating 220 may have reversed wavelength dispersion and a thickness from about 2.8 μm to about 3.4 μm. The liquid crystal coating 220 has an in-plane retardation Ro for incident light having the reference wavelength may range from about 126 nm to about 153 nm, for example, about 130 nm to about 142 nm.

An optical film for a display device according to an exemplary embodiment is described in detail with reference to FIG. 3 to FIG. 6.

Figure 3:
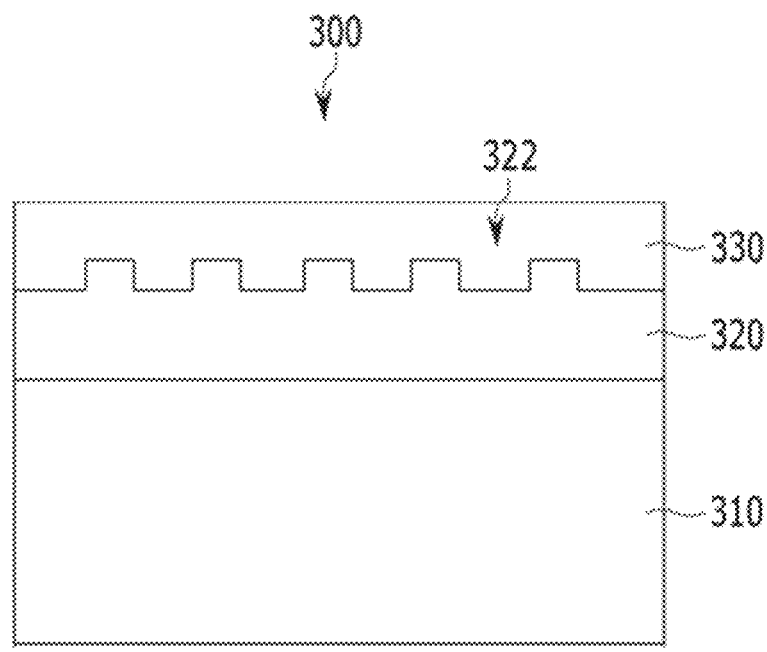
FIG. 3 is a schematic sectional view of an optical film for a display device according to an exemplary embodiment.
Figure 4:
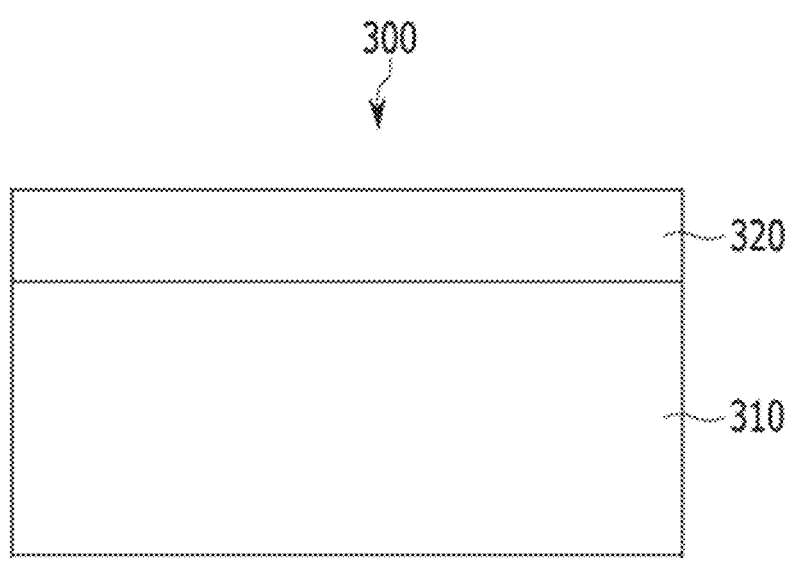
FIG. 4 and FIG. 5 are sectional views illustrating a method of manufacturing the optical film shown in FIG. 3 according to an exemplary embodiment.
Figure 5:
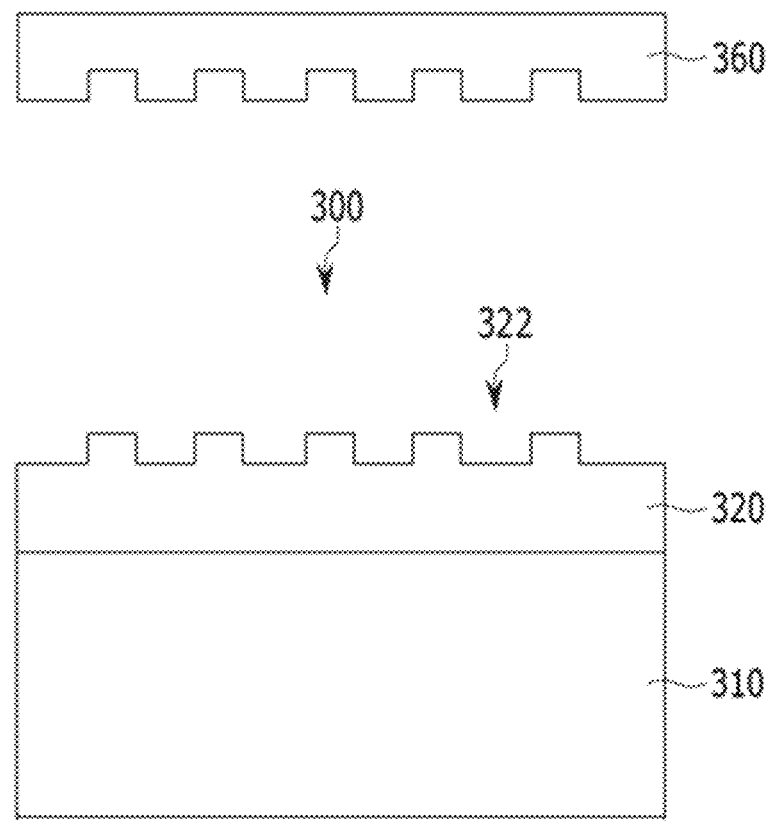
Figure 6:
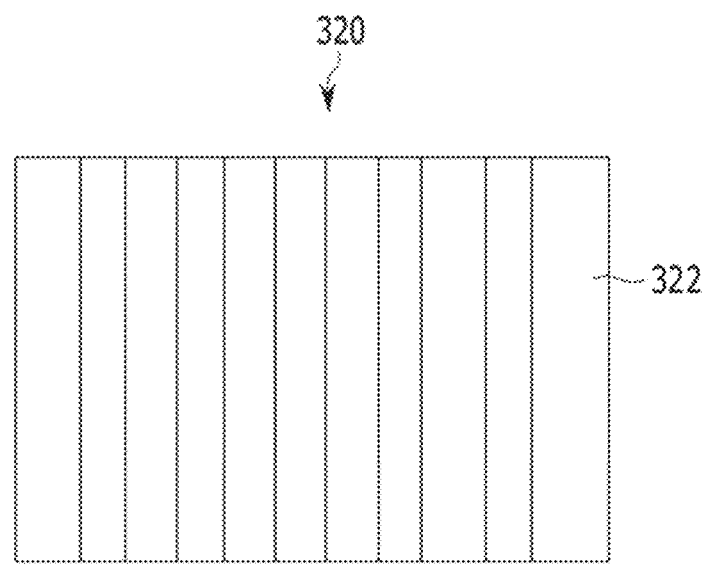
FIG. 6 is a sectional view of an alignment layer according to an exemplary embodiment.

FIG. 3 is a schematic sectional view of an optical film for a display device according to an exemplary embodiment, FIG. 4 and FIG. 5 are sectional views illustrating a method of manufacturing the optical film shown in FIG. 3 according to an exemplary embodiment, and FIG. 6 is a sectional view of an alignment layer according to an exemplary embodiment.

Referring to FIG. 3, an optical film 300 for a display device according to an exemplary embodiment may include a base layer 310, an alignment layer 320 on the base layer 310, and a liquid crystal coating 330 on the alignment layer 320.

The alignment layer 320 may include a photoreaction material, for example, a photosensitive resin, and may have unevenness 322 aligned in a direction. The unevenness 322 may be formed by nano imprint or lithography, for example.

According to an exemplary embodiment, the alignment layer 320 may include a heat sensitive material.

The liquid crystal coating 330 may have reversed wavelength dispersion and a thickness from about 2.8 μm to about 3.4 μm. The liquid crystal coating 330 has an in-plane retardation Ro for incident light having the reference wavelength may range from about 126 nm to about 153 nm, for example, about 130 nm to about 142 nm.

When the optical film 300 is manufactured, referring to FIG. 4, first, a base layer 310 may be coated with a photo sensitive resin or a heat sensitive resin to form an alignment layer 320. Referring to FIG. 5 and FIG. 6, the alignment layer 320 may be pressed with a micro mold 360 having an unevenness pattern to form unevenness 322 aligned in a direction on the alignment layer 320. Subsequently, the alignment layer 320 may be cured by light or heat. Next, a liquid crystal material may be coated to form a liquid crystal coating 330. The liquid crystal coating 330 may be formed by coating, for example, a liquid crystal monomer, a photopolymerizable liquid crystal monomer and a photoreaction initiator on the alignment layer 320, and by drying and light curing (for example, ultra-violet curing) the materials.

The above-described method of forming the alignment layer 320 may cause less damage to the alignment layer 320 compared with rubbing, and may be simple compared with photo-alignment.

The unevenness of the alignment layer 320 may be also formed by atomic force microscopic (AFM) scribing or light interference.

The optical films 100, 200 and 300 shown in FIG. 1 to FIG. 6 may be coupled with a polarization film to form an anti-reflection film for a display device.

Next, an optical film for a display device according to an exemplary embodiment is described in detail with reference to FIG. 7 and FIG. 8.

Figure 7:
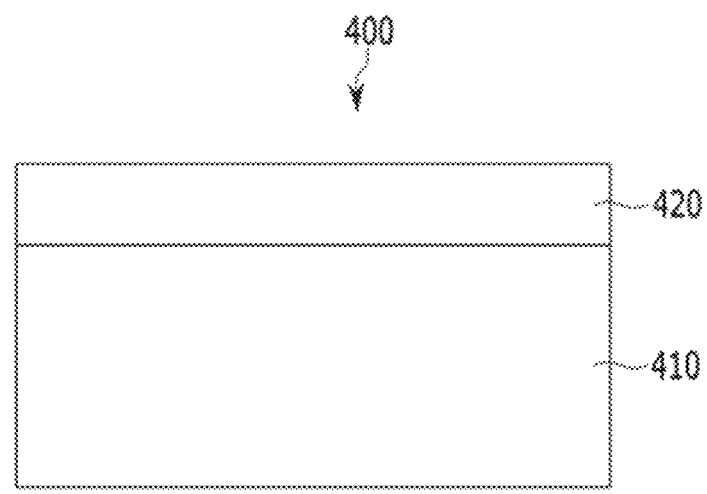
FIG. 7 is a schematic sectional view of an optical film for a display device according to an exemplary embodiment.
Figure 8:
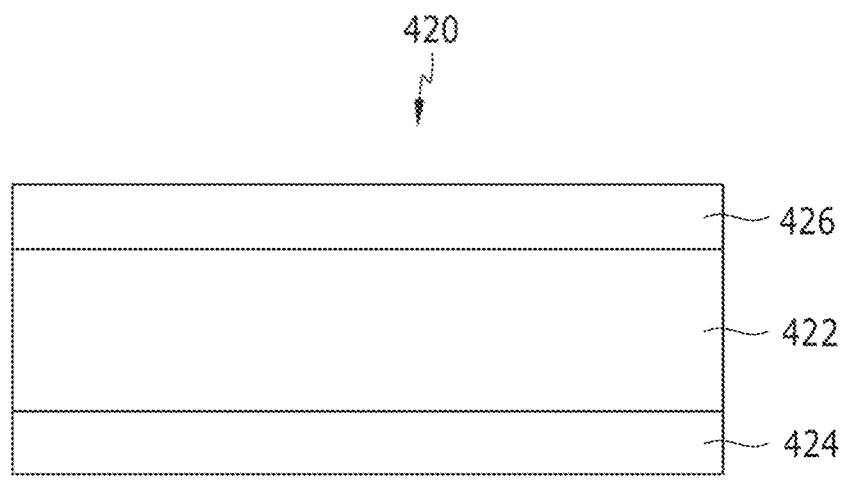
FIG. 8 is a sectional view of an polarization layer according to an exemplary embodiment of an optical film.

FIG. 7 is a schematic sectional view of an optical film for a display device according to an exemplary embodiment, and FIG. 8 is a sectional view of an polarization layer according to an exemplary embodiment of an optical film.

Referring to FIG. 7, an optical film 300 for a display device according to an exemplary embodiment may include an optical retardation layer 410 and a polarization layer 420 on the optical retardation layer 410.

The polarization layer 420 may be a linear polarizer configured to convert the polarization of incident light into linear polarization, and may include poly-vinyl alcohol (PVA) doped with iodine, for example.

The polarization layer 420 may be single-layered, or may include at least two sublayers.

Referring to FIG. 8, for example, the polarization layer 420 according to an exemplary embodiment may include a polarization sublayer 422 and a pair of protection sublayers 424 and 426 disposed on opposite sides of the polarization sublayer 422.

The protection sublayers 424 and 426 may protect the polarization sublayer 422, and may include triacetyl cellulose (TAC), for example. An upper protection sublayer 426 may have characteristics of anti-reflection, low-reflection, anti-glare, or hard coating. One of the two protection sublayers 424 and 426 may be omitted.

The optical retardation layer 410 may be substantially the same as one of the optical films 100, 200 and 300 described with reference to FIG. 1 to FIG. 6.

The optical retardation layer 410 and the polarization layer 420 may be uniaxial.

Next, an optical film for a display device according to an exemplary embodiment is described in detail with reference to FIG. 9.

Figure 9:
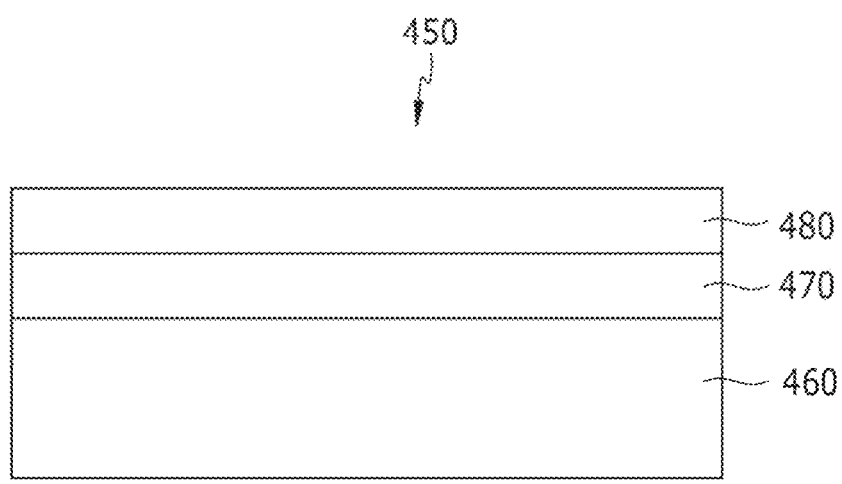
FIG. 9 is a schematic sectional view of an optical film for a display device according to an exemplary embodiment.

FIG. 9 is a schematic sectional view of an optical film for a display device according to an exemplary embodiment.

Referring to FIG. 9, an optical film 450 for a display device according to an exemplary embodiment may include an optical retardation layer 460, a base layer 470 on the optical retardation layer 460, and a polarization layer 480 on the base layer 470.

The optical retardation layer 460 may be substantially the same as one of the optical films 100, 200 and 300 described with reference to FIG. 1 to FIG. 6.

The base layer 470 may be negative c-plate and biaxial. The base layer 470 may have an in-plane retardation value for a reference wavelength ranging from about 0 nm to about 50 nm and an out-of-plane retardation value for a reference wavelength ranging from about 0 nm to about 100 nm. For example, the in-plane retardation value of the base layer 470 may be from about 0 nm to about 10 nm and an out-of-plane retardation value of the base layer 470 may be from about 0 nm to about 70 nm. According to an exemplary embodiment, the in-plane retardation value of the base layer 470 may be about 0 nm and an out-of-plane retardation value of the base layer 470 may be from about 0 nm to about 60 nm.

The polarization layer 480 may be a linear polarizer configured to convert the polarization of incident light into linear polarization, and may include poly-vinyl alcohol (PVA) doped with iodine, for example.

The polarization layer 480 may be single-layered, or may include at least two sublayers. For example, the polarization layer 480 may have a structure shown in FIG. 8.

The optical retardation layer 460 and the polarization layer 480 may be uniaxial.

The optical films 100, 200, 300, 400 and 450 shown in FIG. 1 to FIG. 9 may be used for a display device, for example, a flat panel display such as an organic light emitting display or a liquid crystal display.

An organic light emitting display according to an exemplary embodiment is described in detail with reference to FIGS. 10 and 11.

Figure 10:
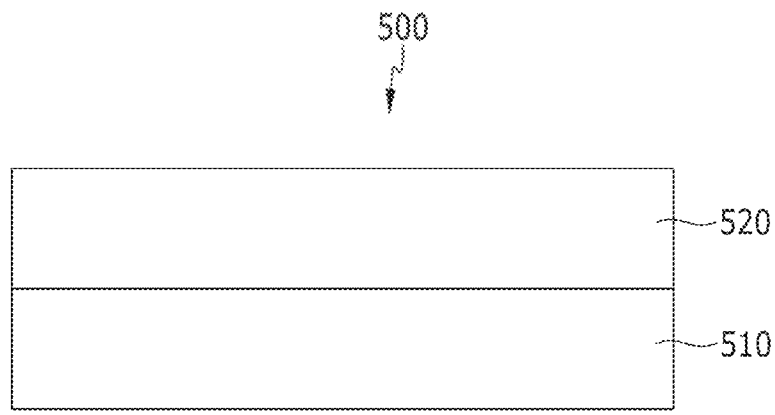
FIG. 10 is a schematic sectional view of an organic light emitting display according to an exemplary embodiment.
Figure 11:
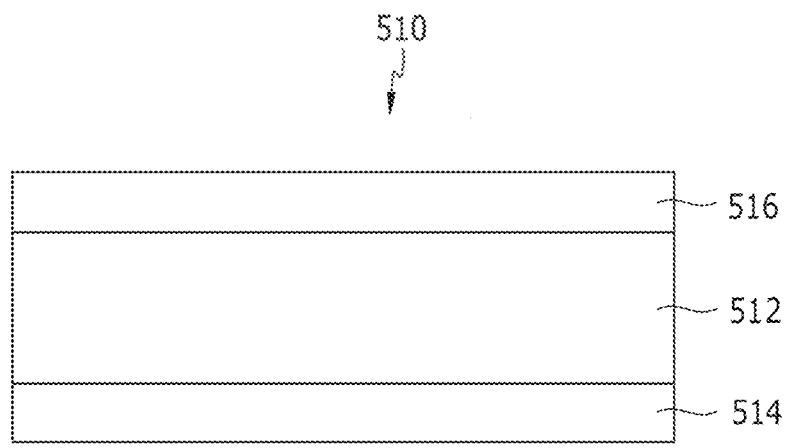
FIG. 11 is a schematic sectional view of an organic light emitting panel of an organic light emitting display according to an exemplary embodiment.

FIG. 10 is a schematic sectional view of an organic light emitting display according to an exemplary embodiment, and FIG. 11 is a schematic sectional view of an organic light emitting panel of an organic light emitting display according to an exemplary embodiment.

Referring to FIG. 10, an organic light emitting display 500 according to an exemplary embodiment includes an organic light emitting panel 510 configured to display images and an optical film 520 attached to the organic light emitting panel 510.

Referring to FIG. 11, the organic light emitting panel 510 may include a pair of electrodes 514 and 516 facing each other and a light emitting layer 512 disposed between the electrodes 514 and 516 and including an organic light emitting material.

The optical film 520 may include the optical retardation layer 410 and the polarization layer 420 as shown in FIG. 7, or may include the optical retardation layer 460, the base layer 470, and the polarization layer 480 as shown in FIG. 9.

External light incident on the organic light emitting display 500 may enter into the organic light emitting panel 510 through the optical film 520, and may be reflected by a reflective member, for example, an electrode of the organic light emitting panel 510. In this case, the external light may be linearly polarized after passing through the polarization layer 524, and then may experience a retardation of about a quarter wavelength such that the linear polarization may be converted into a circular polarization when passing through the optical phase retardation layer 522. After passing through the optical phase retardation layer 522, the circularly polarized external light may be reflected by the reflective member of the organic light emitting panel 510, and then may back towards the optical phase retardation layer 522 again. The reflected light may also experience a retardation of about a quarter wavelength when secondly passing through the optical phase retardation layer 522 such that the circular polarization of the light may be converted into a linear polarization. As a result, the external light initially incident on the organic light emitting panel 510 after firstly passing through the polarization layer 524 may pass through the optical phase retardation layer 522 twice such that a polarization axis of the external light rotates about 90 degrees when the external light reaches the polarization layer 524 again. As a result, even when external light is reflected in the organic light emitting display 500 including the organic light emitting panel 510, leaking of the reflected light from the organic light emitting display 500 is reduced or effectively prevented, thereby improving the image quality of the organic light emitting display 500.

Exemplary Example embodiments of an optical film for a display device are described in detail with reference to FIG. 12 and FIG. 15.

Figure 12:
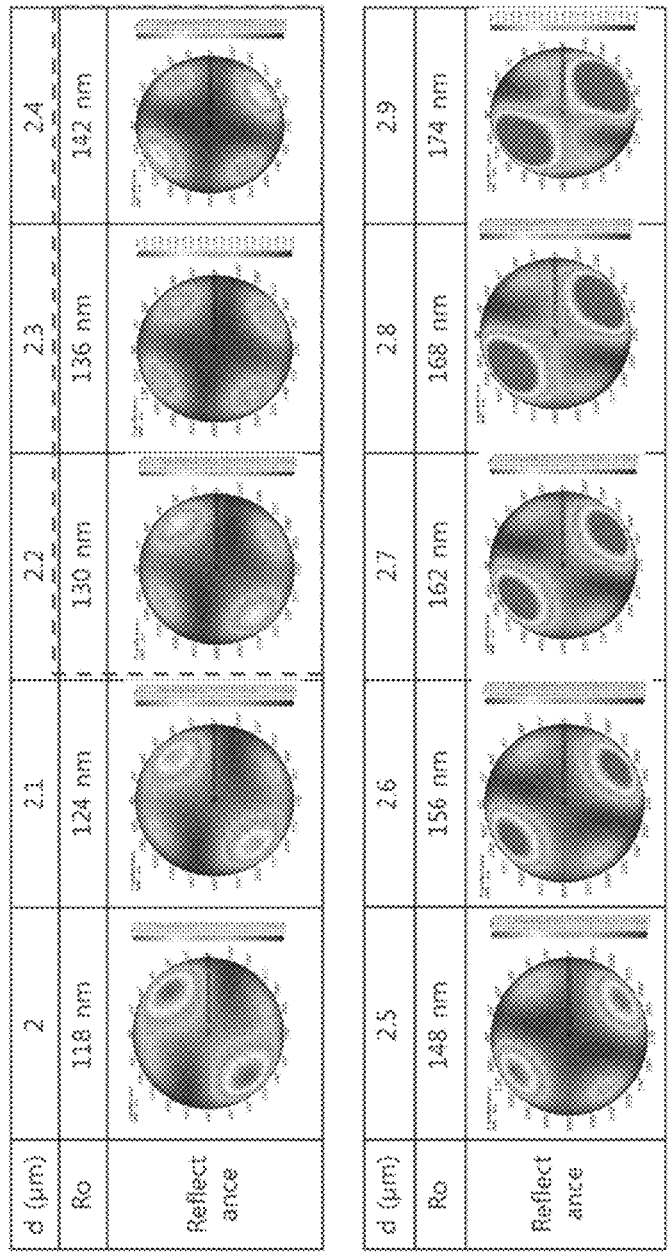
FIG. 12 is a graph illustrating reflectance of an optical film according to exemplary embodiment examples for various values of in-plane retardation of an optical retardation layer in the optical film.
Figure 13:
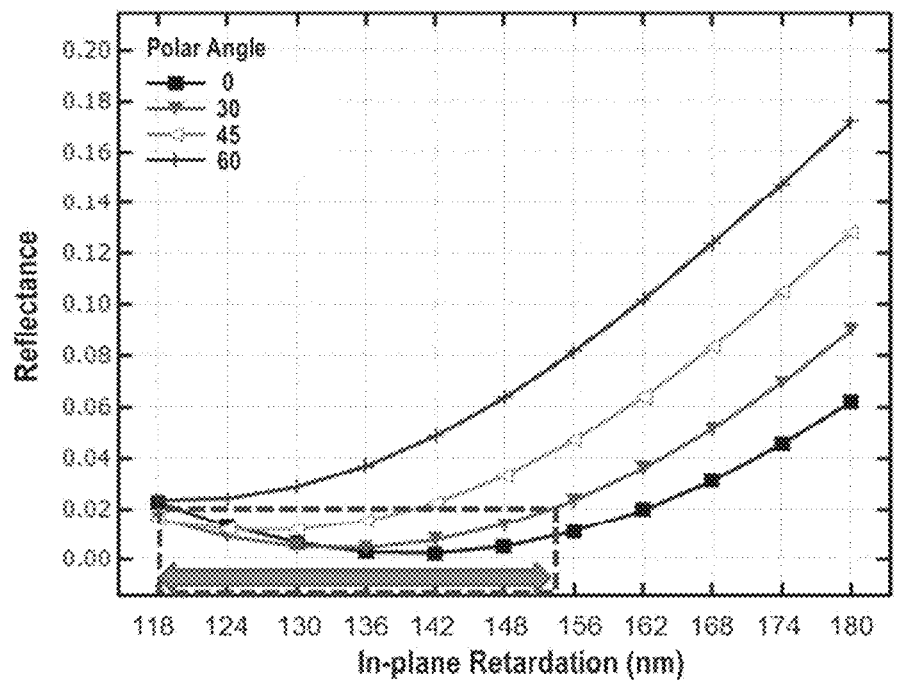
FIG. 13 to FIG. 15 are graphs illustrating reflectance of an optical film as function of in-plane retardation value of an optical retardation layer in the optical film.
Figure 14:
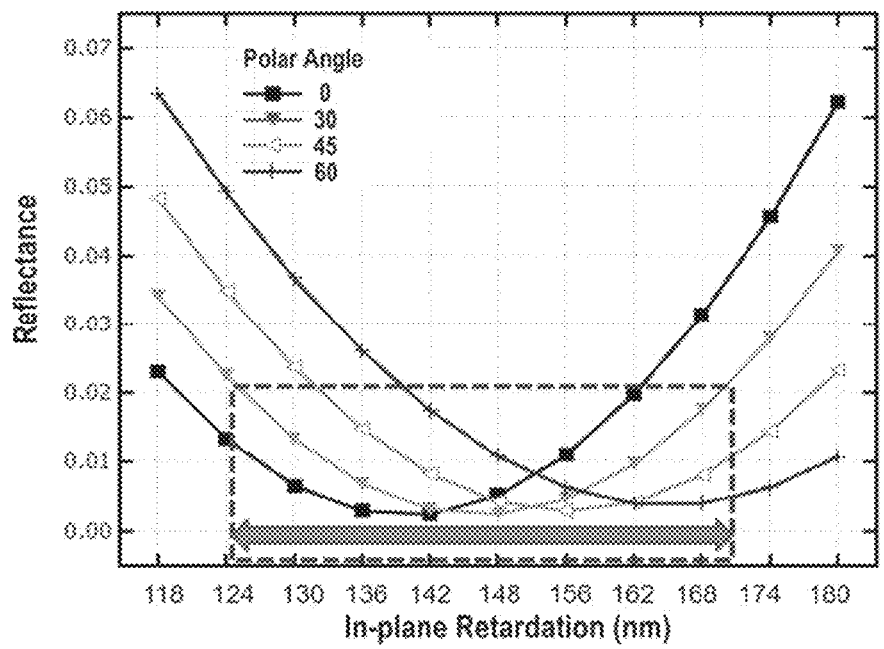
Figure 15:
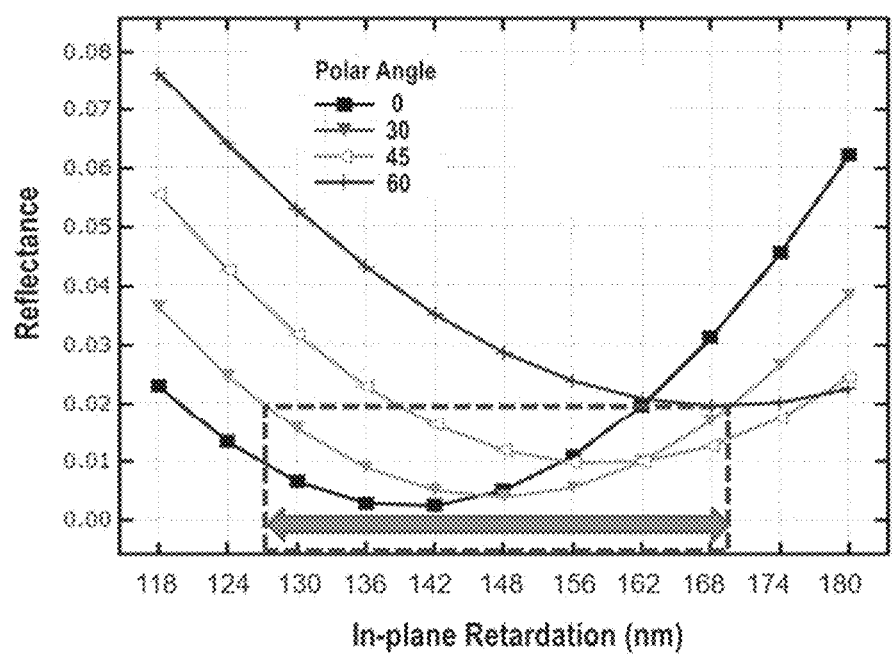

FIG. 12 is a graph illustrating reflectance of an optical film according to exemplary embodiment examples for various values of in-plane retardation of an optical retardation layer in the optical film, and FIG. 13 to FIG. 15 are graphs illustrating reflectance of an optical film as function of in-plane retardation value of an optical retardation layer in the optical film.

The reflectance of an optical film is calculated using a simulation device LCD Master. The optical film has a structure shown in FIG. 7, and includes an optical retardation layer shown in FIG. 3.

A coated liquid crystal material forming the optical retardation layer has refractive anisotropy is about 0.0045, short-wavelength dispersion (=retardation for incident light with a wavelength of about 450 nm/retardation for incident light with a wavelength of about 550 nm) is about 0.88, and long-wavelength dispersion (=retardation for incident light with a wavelength of about 650 nm/retardation for incident light with a wavelength of about 550 nm) is about 1.02.

An ideal reflector is used for reflecting light from the optical film to the optical film.

In FIG. 12, the thickness of the optical retardation layer increases from about 2 μm to about 2.9 μm by about 0.1 μm, and the in-plane retardation value of the optical retardation layer changes from about 118 nm to about 174 nm by about 6 nm.

In FIG. 13 to FIG. 15, the polar angle changes from about 0 degree, to about 30 degrees, about 45 degrees, and about 60 degrees. The azimuthal angle is about 120 degrees in FIG. 13, about 60 degrees in FIG. 14, and about 40 degrees in FIG. 15.

Referring to FIG. 12, the reflectance is generally low when the in-plane retardation (Ro) value of the optical retardation layer for the reference wavelength ranges from about 130 nm to about 142 nm.

Referring to FIG. 13 where the azimuthal angle is about 120 degrees, the reflectance in the polar angle of about 30 degrees is lower than about 0.02 when the in-plane retardation (Ro) value of the optical retardation layer ranges from about 118 nm to about 153 nm.

Referring to FIG. 14 where the azimuthal angle is about 60 degrees, the reflectance in the polar angle of about 30 degrees is lower than about 0.02 when the in-plane retardation (Ro) value of the optical retardation layer ranges from about 125 nm to about 170 nm.

Referring to FIG. 15 where the azimuthal angle is about 40 degrees, the reflectance in the polar angle of about 30 degrees is lower than about 0.02 when the in-plane retardation (Ro) value of the optical retardation layer ranges from about 126 nm to about 169 nm.

Therefore, the reflectance of the optical film shown in FIG. 7 in the azimuthal angles of about 120 degrees, about 60 degrees, and about 40 degrees is lower than about 0.02 when the in-plane retardation (Ro) value of the optical retardation layer ranges from about 126 nm to about 153 nm.

Exemplary Example embodiments of an optical film for a display device are described in detail with reference to FIG. 16 and FIG. 19.

Figure 16:
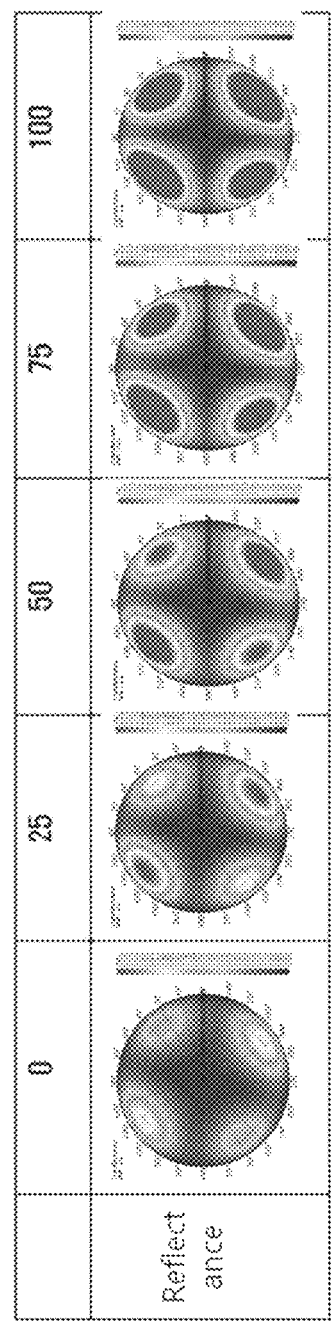
FIG. 16 is a graph illustrating reflectance of an optical film according to exemplary embodiment examples for various values of out-of-plane retardation of a base layer in the optical film.
Figure 17:
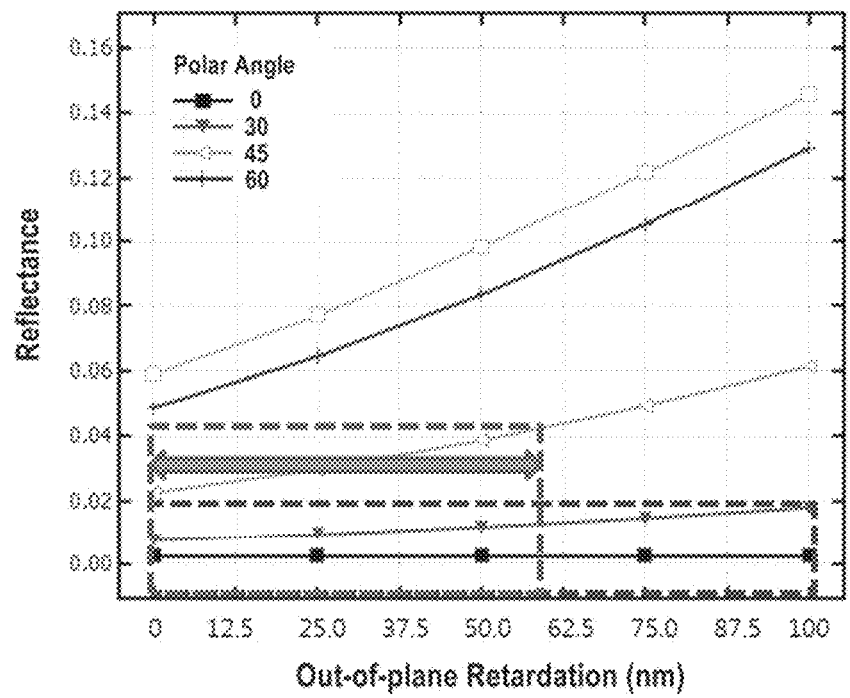
FIG. 17 to FIG. 19 are graphs illustrating reflectance of an optical film as function of in out-of-plane retardation of a base layer in the optical film.
Figure 18:
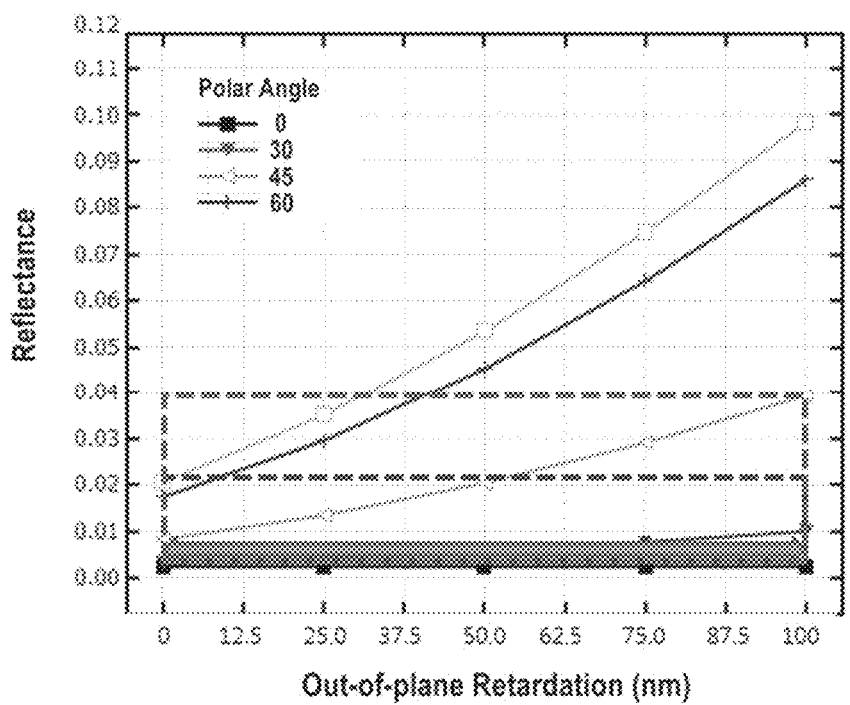
Figure 19:
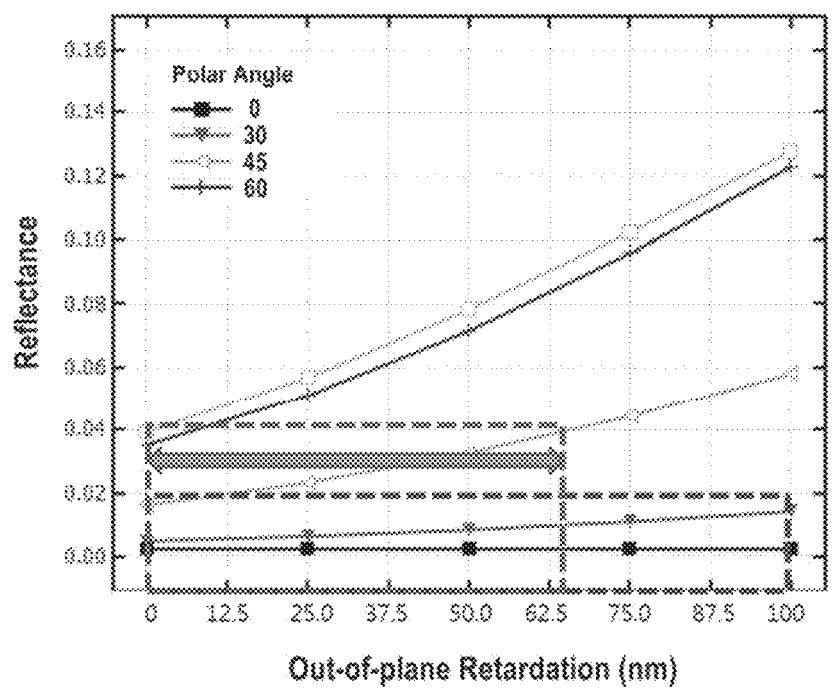

FIG. 16 is a graph illustrating reflectance of an optical film according to exemplary embodiment examples for various values of out-of-plane retardation of a base layer in the optical film, and FIG. 17 to FIG. 19 are graphs illustrating reflectance of an optical film as function of in out-of-plane retardation of a base layer in the optical film.

The reflectance of an optical film is calculated using LCD Master. The optical film has a structure shown in FIG. 9, and includes an optical retardation layer shown in FIG. 3.

A coated liquid crystal material forming an optical retardation layer has refractive anisotropy is about 0.0045, short-wavelength dispersion (=retardation for incident light with a wavelength of about 450 nm/retardation for incident light with a wavelength of about 550 nm) is about 0.88, and long-wavelength dispersion (=retardation for incident light with a wavelength of about 650 nm/retardation for incident light with a wavelength of about 550 nm) is about 1.02.

An ideal reflector is used for reflecting light from the optical film to the optical film.

The optical retardation layer has an in-plane retardation value of about 142 nm, and the base layer has an in-plane retardation value of about 0.

In FIG. 16, the out-of-plane retardation Rth value of the base layer changes from about 0 nm to about 100 nm by about 25 nm.

In FIG. 17 to FIG. 19, the polar angle changes from about 0 degree, to about 30 degrees, about 45 degrees, and about 60 degrees. The azimuthal angle is about 120 degrees in FIG. 17, about 60 degrees in FIG. 18, and about 40 degrees in FIG. 19.

Referring to FIG. 16, the reflectance decreases as the out-of-plane retardation Rth value of the base layer decreases.

Referring to FIG. 17 where the azimuthal angle is about 120 degrees, the reflectance in the polar angle of about 30 degrees is lower than about 0.02 and the reflectance in the polar angle of about 45 degrees is lower than about 0.04 when the out-of-plane retardation Rth value of the base layer ranges from about 0 nm to about 60 nm.

Referring to FIG. 18 where the azimuthal angle is about 60 degrees, the reflectance in the polar angle of about 30 degrees is lower than about 0.02 and the reflectance in the polar angle of about 45 degrees is lower than about 0.04 when the out-of-plane retardation Rth value of the base layer ranges from about 0 nm to about 100 nm.

Referring to FIG. 19 where the azimuthal angle is about 40 degrees, the reflectance in the polar angle of about 30 degrees is lower than about 0.02 and the reflectance in the polar angle of about 45 degrees is lower than about 0.04 when the out-of-plane retardation Rth value of the base layer ranges from about 0 nm to about 65 nm.

Therefore, for the azimuthal angles of about 120 degrees, about 60 degrees, and about 40 degrees, the reflectance in the polar angle of about 30 degrees is lower than about 0.02 and the reflectance in the polar angle of about 45 degrees is lower than about 0.04 when the out-of-plane retardation Rth value of the base layer ranges from about 0 nm to about 60 nm.

Exemplary Example embodiments of an optical film for a display device are described in detail with reference to FIG. 20 and FIG. 22.

Figure 20:
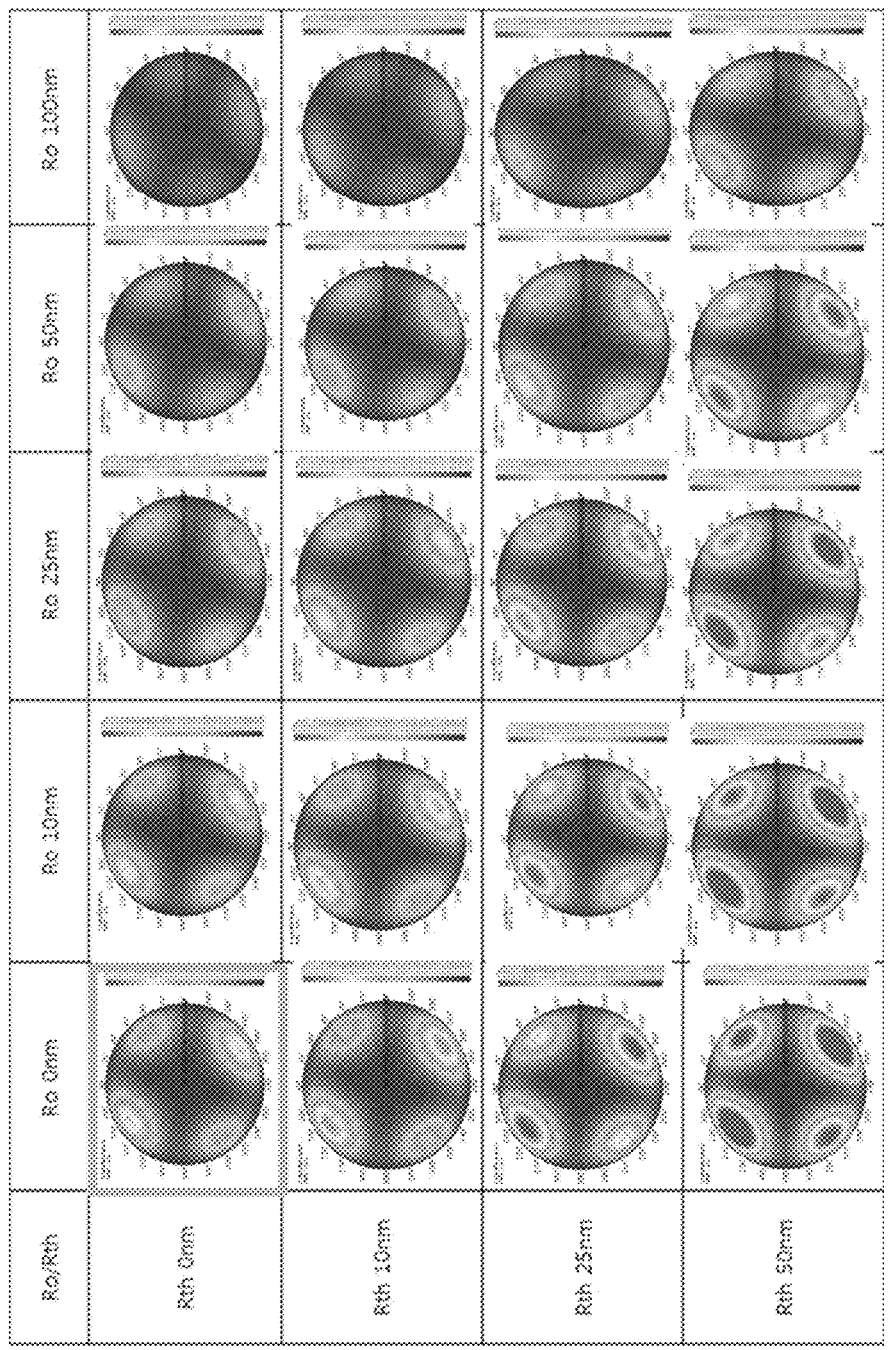
FIG. 20 is a graph illustrating reflectance of an optical film according to exemplary embodiment examples for various values of in-plane retardation Ro and out-of-plane retardation Rth of a base layer in the optical film.
Figure 21:
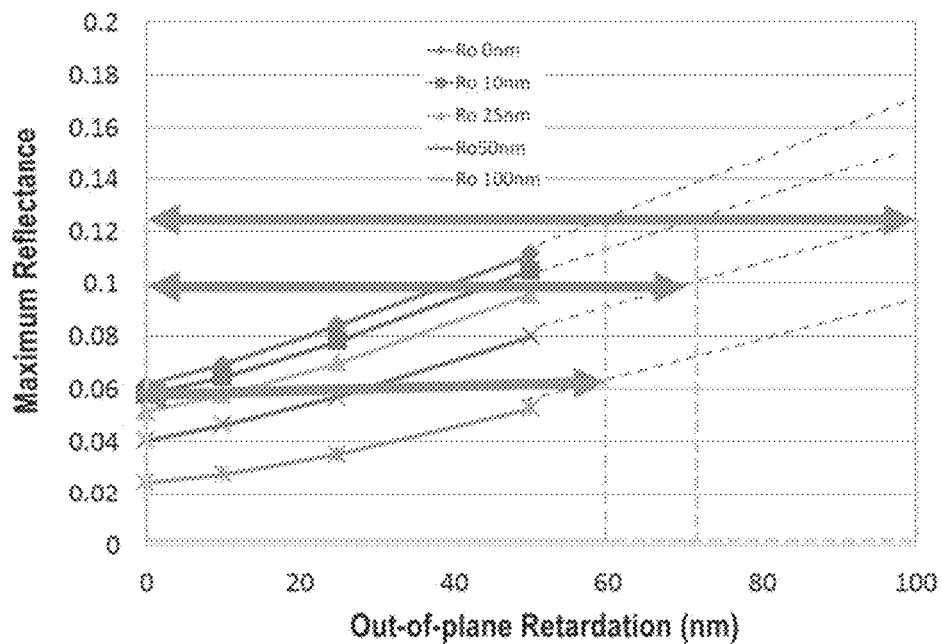
FIG. 21 is a graph illustrating a maximum reflectance of an optical film as function of out-of-plane retardation Rth of a base layer in the optical film for various values of in-plane retardation Ro of the base layer.
Figure 22:
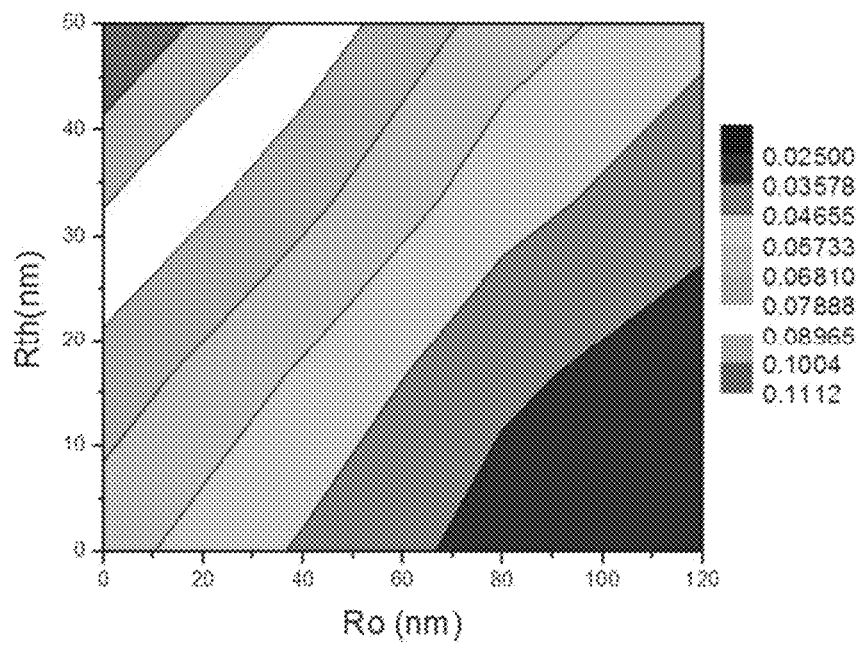
FIG. 22 is a graph illustrating a maximum reflectance of an optical film as function of in-plane retardation Ro and out-of-plane retardation Rth of a base layer in the optical film.

FIG. 20 is a graph illustrating reflectance of an optical film according to exemplary embodiment examples for various values of in-plane retardation $R_o$ and out-of-plane retardation $R_{th}$ of a base layer in the optical film, FIG. 21 is a graph illustrating a maximum reflectance of an optical film as function of out-of-plane retardation $R_{th}$ of a base layer in the optical film for various values of in-plane retardation $R_o$ of the base layer, and FIG. 22 is a graph illustrating a maximum reflectance of an optical film as function of in-plane retardation $R_o$ and out-of-plane retardation $R_{th}$ of a base layer in the optical film.

The reflectance of an optical film is calculated using LCD Master. The optical film has a structure shown in FIG. 7 ($R_o$=0, $R_{th}$=0) and FIG. 9, and includes an optical retardation layer shown in FIG. 3.

A coated liquid crystal material forming an optical retardation layer has refractive anisotropy is about 0.0045, short-wavelength dispersion (=retardation for incident light with a wavelength of about 450 nm/retardation for incident light with a wavelength of about 550 nm) is about 0.88, and long-wavelength dispersion (=retardation for incident light with a wavelength of about 650 nm/retardation for incident light with a wavelength of about 550 nm) is about 1.02.

An ideal reflector is used for reflecting light from the optical film to the optical film.

In FIG. 20 and FIG. 21, the out-of-plane retardation $R_{th}$ value of the base layer changes from about 0 nm to about 10 nm, about 25 nm, and about 50 nm, and the in-plane retardation $R_o$ value of the base layer changes from about 0 nm, about 10 nm, about 25 nm, about 50 nm, and about 100 nm.

A maximum reflectance as function of the out-of-plane retardation $R_{th}$ and the in-plane retardation $R_o$ of the base layer is shown in Table 1.

TABLE 1

| Rth | Ro 0 | Ro 10 | Ro 25 | Ro 50 | Ro 100 |
|---|---|---|---|---|---|
| Rth 0 | 0.061 | 0.057 | 0.051 | 0.040 | 0.024 |
| Rth 10 | 0.069 | 0.064 | 0.057 | 0.046 | 0.027 |
| Rth 25 | 0.083 | 0.078 | 0.069 | 0.057 | 0.035 |
| Rth 50 | 0.11 | 0.104 | 0.095 | 0.080 | 0.052 |

Referring to Table 1 and FIG. 20 to FIG. 22, the reflectance decreases as the in-plane retardation $R_o$ of the base layer increases and the out-of-plane retardation $R_{th}$ of the base layer decreases. In particular, the reflectance is equal to or lower than about 0.12 $cd/m^2$ regardless of the retardation when the out-of-plane retardation $R_{th}$ of the base layer ranges from about 0 nm to about 60 nm.

In detail, the reflectance is low when the in-plane retardation value of the base layer ranging from about 0 nm to about 50 nm and the out-of-plane retardation value ranging from about 0 nm to about 100 nm. Furthermore, the reflectance is low when the in-plane retardation value of the base layer may be from about 0 nm to about 10 nm and an out-of-plane retardation value of the base layer may be from about 0 nm to about 70 nm. In addition, the reflectance is low when the in-plane retardation value of the base layer may be about 0 nm and an out-of-plane retardation value of the base layer may be from about 0 nm to about 60 nm.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An optical film comprising:
 a liquid crystal layer having reversed wavelength dispersion, the liquid crystal layer being a quarter-wave retarder; and
 a base layer on the liquid crystal layer,
 wherein the base layer comprises a negative c-plate.

2. The optical film of claim 1, wherein the base layer has in-plane retardation ranging from about 0 to about 50 nm.

3. The optical film of claim 1, wherein the base layer has in-plane retardation equal to or greater than about 30 nm.

4. The optical film of claim 1, further comprising a polarization layer on the base layer.

5. The optical film of claim 1, further comprising an alignment layer disposed between the base layer and the liquid crystal layer.

6. The optical film of claim 5, wherein the alignment layer has unevenness aligned in a direction.

7. An optical film comprising:
 a liquid crystal layer having reversed wavelength dispersion, the liquid crystal layer being a quarter-wave retarder; and
 a base layer on the liquid crystal layer,
 wherein the base layer has optical biaxiality.

8. The optical film of claim 7, wherein the base layer has in-plane retardation ranging from about 0 to about 50 nm.

9. The optical film of claim 7, wherein the base layer has in-plane retardation equal to or greater than about 30 nm.

10. The optical film of claim 7, further comprising a polarization layer on the base layer.

11. The optical film of claim 7, further comprising an alignment layer disposed between the base layer and the liquid crystal layer.

12. The optical film of claim 11, wherein the alignment layer has unevenness aligned in a direction.

* * * * *